United States Patent
Nakashoya

(10) Patent No.: US 11,801,537 B2
(45) Date of Patent: Oct. 31, 2023

(54) SUBSTRATE PROCESSING APPARATUS AND SUBSTRATE PROCESSING METHOD

(71) Applicant: Tokyo Electron Limited, Tokyo (JP)

(72) Inventor: Takahito Nakashoya, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/661,601

(22) Filed: May 2, 2022

(65) Prior Publication Data
US 2022/0362813 A1 Nov. 17, 2022

(30) Foreign Application Priority Data
May 11, 2021 (JP) ................... 2021-080561

(51) Int. Cl.
*B08B 3/02* (2006.01)
*B08B 13/00* (2006.01)
*H01L 21/02* (2006.01)

(52) U.S. Cl.
CPC .............. *B08B 3/022* (2013.01); *B08B 13/00* (2013.01); *H01L 21/02057* (2013.01)

(58) Field of Classification Search
CPC .......... B08B 3/022; B08B 13/00; B08B 5/02; H01L 21/02057; H01L 21/67017; H01L 21/67173; H01L 21/68792; H01L 21/67051; H01L 21/67253; H01L 21/68728; H01L 21/6875
See application file for complete search history.

(56) References Cited

U.S. PATENT DOCUMENTS

| | | | | |
|---|---|---|---|---|
| 5,762,709 A | * | 6/1998 | Sugimoto | H01L 21/6715 118/500 |
| 6,177,133 B1 | * | 1/2001 | Gurer | B05D 1/005 427/240 |
| 6,494,220 B1 | * | 12/2002 | Matsuda | H01L 21/67051 134/182 |
| 2008/0176003 A1 | * | 7/2008 | Tsutsumi | H01L 21/6715 427/508 |
| 2013/0213437 A1 | * | 8/2013 | Ishii | B08B 1/001 15/97.1 |
| 2014/0071411 A1 | * | 3/2014 | Takiguchi | G03F 7/3021 355/27 |
| 2015/0000056 A1 | * | 1/2015 | Togawa | H01L 21/67051 15/97.1 |
| 2020/0402836 A1 | * | 12/2020 | Park | H01L 21/68792 |

FOREIGN PATENT DOCUMENTS

JP   H10-135178 A   5/1998

* cited by examiner

*Primary Examiner* — Erin F Bergner
(74) *Attorney, Agent, or Firm* — Armstrong Teasdale LLP

(57) ABSTRACT

An apparatus includes: a substrate holder including a base member and configured to hold a substrate so as to be spaced apart upward from the base member; a rotary driver configured to rotationally drive the substrate holder; a processing liquid nozzle configured to supply a processing liquid to the substrate; a liquid receiving cup configured to receive the processing liquid scattered from the substrate; a cup exhaust passage configured to suction an atmosphere in the liquid receiving cup; a purge gas nozzle configured to discharge a purge gas into a space formed between the substrate and the base member; a purge gas flow rate controller configured to control a flow rate of the purge gas discharged from the purge gas nozzle; and a controller configured to control at least an operation of the purge gas flow rate controller.

8 Claims, 4 Drawing Sheets

SUBSTRATE PROCESSING APPARATUS AND SUBSTRATE PROCESSING METHOD

CROSS-REFERENCE TO RELATED APPLICATION

This application is based upon and claims the benefit of priority from Japanese Patent Application No. 2021-080561, filed on May 11, 2021, the entire contents of which are incorporated herein by reference.

TECHNICAL FIELD

The present disclosure relates to a substrate processing apparatus and a substrate processing method.

BACKGROUND

In the manufacture of a semiconductor device, a substrate processing apparatus is used in which a cleaning process is performed on an upper surface and/or a lower surface of a substrate while rotating the substrate held in a horizontal posture about a vertical axis. Patent Document 1 discloses an example of such a substrate processing apparatus. This substrate processing apparatus includes a disk-shaped spin base and three or more substrate holding members provided near a peripheral edge portion of the spin base. A cleaning liquid supplier and a gas injection port are provided at the central portion of the spin base. The cleaning process is performed in which the lower surface of the substrate is cleaned by supplying a cleaning liquid to the central portion of the lower surface of the substrate by the cleaning liquid supplier while rotating the substrate. Thereafter, a drying process is performed in which the supply of the cleaning liquid is stopped and the rotation of the substrate is continued to dry the substrate.

During the drying process, a gas (inert gas or dry air) is supplied from the gas injection port to a space below the substrate to promote drying. When the cleaning liquid is introduced into the gas injection port during the cleaning process, the introduced cleaning liquid blows out like a mist at the start of gas discharge and contaminates the substrate. In order to prevent this problem, even during the cleaning process, the gas is blown out from the gas injection port at a flow rate smaller than that during the drying process.

PRIOR ART DOCUMENT

Patent Document

Patent Document 1: Japanese Laid-Open Patent Publication No. H10-135178

SUMMARY

According to an embodiment of the present disclosure, a substrate processing apparatus includes: a substrate holder including a disk-shaped base member and a plurality of holding members provided on a peripheral edge portion of the disk-shaped base member and configured to hold a substrate so as to be spaced apart upward from the disk-shaped base member, and configured to hold the substrate in a horizontal posture; a rotary driver configured to rotationally drive the substrate holder about a vertical axis; a processing liquid nozzle configured to supply a processing liquid to the substrate held by the substrate holder; a liquid receiving cup provided around the substrate holder and configured to receive the processing liquid scattered from the substrate held and rotated by the substrate holder; a cup exhaust passage configured to suction an atmosphere in the liquid receiving cup, the cup exhaust passage having a first end connected to an exhaust port of the liquid receiving cup and a second end connected to a negative pressure generation source; a purge gas nozzle configured to discharge a purge gas into a substrate lower space formed between a lower surface of the substrate held by the substrate holder and an upper surface of the disk-shaped base member; a purge gas flow rate controller configured to control a first flow rate of the purge gas discharged from the purge gas nozzle; and a controller configured to control at least an operation of the purge gas flow rate controller, wherein the controller is configured to control the operation of the purge gas flow rate controller so that the purge gas is discharged from the purge gas nozzle into the substrate lower space at a second flow rate that cancels a negative pressure generated in the substrate lower space.

BRIEF DESCRIPTION OF DRAWINGS

The accompanying drawings, which are incorporated in and constitute a portion of the specification, illustrate embodiments of the present disclosure, and together with the general description given above and the detailed description of the embodiments given below, serve to explain the principles of the present disclosure.

DETAILED DESCRIPTION

An embodiment of the substrate processing apparatus will be described with reference to the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
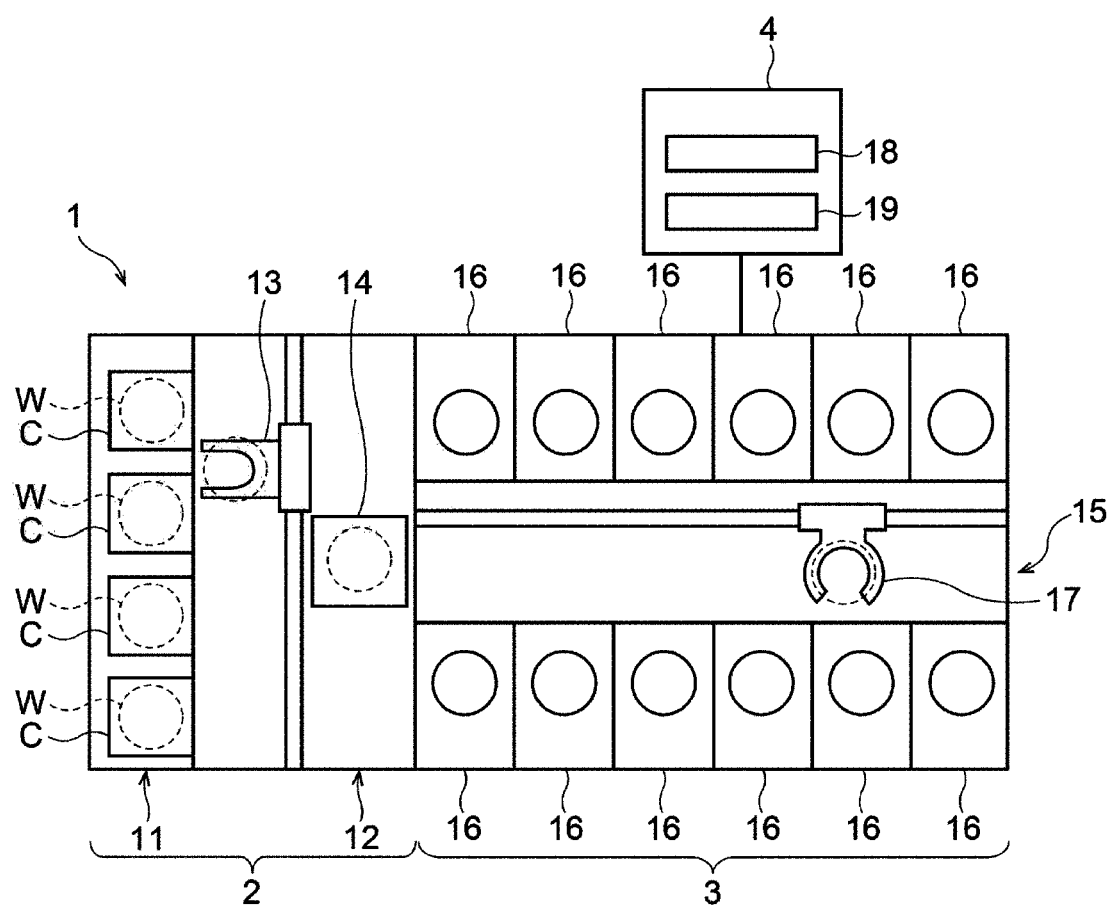
FIG. 1 is a vertical sectional side view of a substrate processing apparatus according to an embodiment.

FIG. 1 is a diagram showing a schematic configuration of a substrate processing system according to the present embodiment. In the following description, in order to clarify the positional relationship, an X-axis, a Y-axis and a Z-axis orthogonal to one another are defined, and a positive direction of the Z-axis is defined as a vertical upward direction.

As shown in FIG. 1, the substrate processing system 1 includes a loading/unloading station 2 and a processing station 3. The loading/unloading station 2 and the processing station 3 are provided adjacent to each other.

The loading/unloading station 2 includes a carrier placement part 11 and a transfer part 12. A plurality of carriers C for accommodating a plurality of substrates, for example, a plurality of semiconductor wafers (hereinafter referred to as wafers W) in the present embodiment, in a horizontal state is placed on the carrier placement part 11.

The transfer part 12 is provided adjacent to the carrier placement part 11 and includes a substrate transfer device 13 and a delivery part 14 arranged therein. The substrate transfer device 13 includes a wafer holding mechanism for holding a wafer W. Further, the substrate transfer device 13 can move in the horizontal direction and the vertical direction and swivel around the vertical axis. The substrate transfer device 13 transfers the wafer W between the carrier C and the delivery part 14 by using the wafer holding mechanism.

The processing station 3 is provided adjacent to the transfer part 12. The processing station 3 includes a transfer part 15 and a plurality of processing units 16. The processing units 16 are provided side by side on both sides of the transfer part 15.

The transfer part 15 includes a substrate transfer device 17 arranged therein. The substrate transfer device 17 includes a wafer holding mechanism for holding the wafer W. Further, the substrate transfer device 17 can move in the horizontal direction and the vertical direction and swivel around the vertical axis. The substrate transfer device 17 transfers the wafer W between the delivery part 14 and the processing units 16 by using the wafer holding mechanism.

The processing unit 16 performs a predetermined substrate processing on the wafer W transferred by the substrate transfer device 17.

Further, the substrate processing system 1 includes a control device 4. The control device 4 is, for example, a computer, and includes a controller 18 and a memory part 19. The memory part 19 stores a program that controls various processes executed in the substrate processing system 1. The controller 18 controls the operation of the substrate processing system 1 by reading and executing the program stored in the memory part 19.

The program is recorded on a non-transitory computer-readable storage medium and may be installed from the storage medium on the memory part 19 of the control device 4. Examples of the computer-readable storage medium include a hard disk (HD), a flexible disk (FD), a compact disk (CD), a magnetic optical disk (MO), a memory card, and the like.

In the substrate processing system 1 configured as described above, first, the substrate transfer device 13 of the loading/unloading station 2 unloads the wafer W from the carrier C placed on the carrier placement part 11 and mounts the unloaded wafer W on the delivery part 14. The wafer W placed on the delivery part 14 is unloaded from the delivery part 14 by the substrate transfer device 17 of the processing station 3 and loaded into the processing unit 16.

The wafer W loaded into the processing unit 16 is processed by the processing unit 16, unloaded from the processing unit 16 by the substrate transfer device 17, and placed on the delivery part 14. Then, the processed wafer W placed on the delivery part 14 is returned to the carrier C of the carrier placement part 11 by the substrate transfer device 13.

Next, a configuration of the processing unit 16 will be described with reference to FIG. 2.

Figure 2:
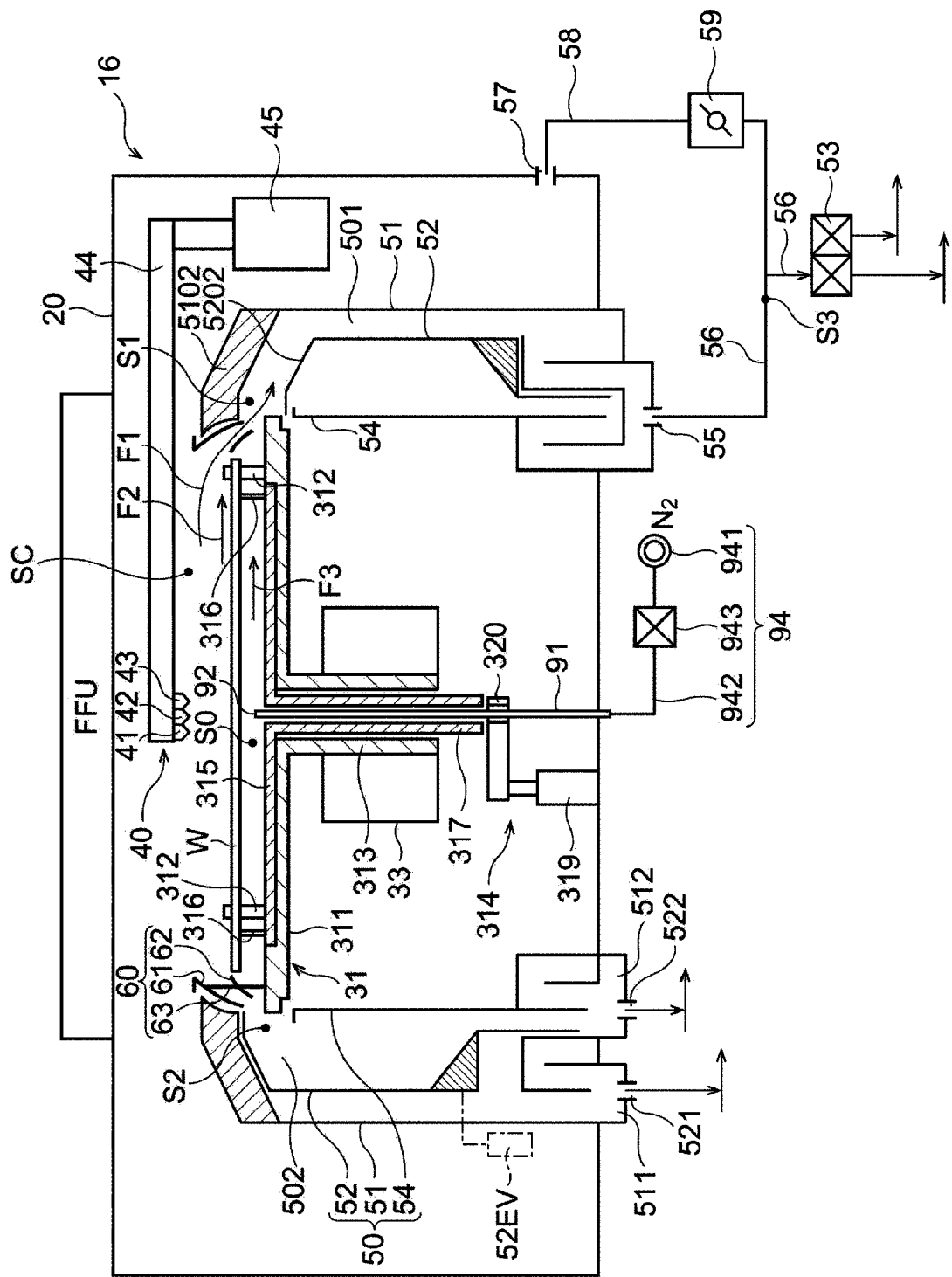
FIG. 2 is a schematic vertical cross-sectional view of a processing unit included in the substrate processing apparatus.

As shown in FIG. 2, the processing unit 16 includes a chamber 20, a substrate holding/rotating mechanism 30, a processing fluid supplier 40, a liquid receiving cup 50, and a rotary cup 60.

The chamber 20 accommodates the substrate holding/rotating mechanism 30, the processing fluid supplier 40, and the liquid receiving cup 50. A fan filter unit (FFU) 21 is provided on the ceiling of the chamber 20. The FFU 21 forms a down-flow inside the chamber 20.

The substrate holding/rotating mechanism 30 includes a substrate holder 31 and a rotary driver 33. The substrate holder 31 includes a disk-shaped base plate 311 having a diameter slightly larger than that of the wafer W, a plurality of chuck portions (holding members) 312 provided on the peripheral edge of the base plate 311, and a hollow rotary shaft 313 extending downward from the central portion of the lower surface of the base plate 311. By gripping the wafer W with the chuck portions 312, the wafer W is held by the substrate holder 31 in a horizontal posture. The rotary driver 33 is composed of, for example, an electric rotation motor, and can rotate the rotary shaft 313 around a vertical axis.

The substrate holder 31 further includes a substrate elevator 314. The substrate elevator 314 includes a disk body 315 fitted to a circular recess formed on the upper surface of the base plate 311 of the substrate holder 31, a plurality of support pins 316 protruding from the upper surface of the disk body 315, and a hollow shaft 317 extending downward from the central portion of the lower surface of the disk body 315. The shaft 317 of the substrate elevator 314 is accommodated inside the rotary shaft 313 of the substrate holder 31.

An elevating mechanism 318 is provided to raise and lower the substrate elevator 314. The elevating mechanism 318 includes a linear actuator 319 such as an air cylinder or a ball screw, and a lift member 320 which is moved in the vertical direction by the linear actuator 319 to push up a lower end of the shaft 317. The elevating mechanism 318 allows the disk body 315 to be moved between a lowered position (position shown in FIG. 2) and a raised position (position spaced apart upward from the base plate 311).

The chuck portions 312 of the substrate holder 31 can be moved between a gripping position for gripping the peripheral edge portion of the wafer W and a release position away from the wafer W by a chuck operating mechanism attached to the base plate 311. The chuck operating mechanism is composed of, for example, a link mechanism that can be operated by being pushed by the disk body 315 which is moving toward the lowered position. The chuck operating mechanism is configured to position the chuck portions 312 at the gripping position when the disk body 315 is in the lowered position and is configured to position the chuck portions 312 at the release position when the disk body 315 is in the raised position. Such a chuck operating mechanism is known and, therefore, the illustration and description thereof will be omitted.

At least when the disk body 315 is in the lowered position, the base plate 311 and the disk body 315 are rotated together by an appropriate interlock structure composed of complementary irregularities (for example, protrusions provided on one of the upper surface of the disk body 315 and the lower surface of the base plate 311 and recesses provided on the other side).

That is, the base plate 311 and the disk body 315 can be relatively moved up and down. At least when the disk body 315 is in the lowered position, or at all times, the base plate 311 and the disk body 315 cannot rotate relative to each other. The rotary shaft 313 of the base plate 311 and the shaft 317 of the disk body 315 may be engaged with each other so as to be relatively movable up and down and relatively non-rotatable.

When the wafer W is loaded into the processing unit 16, the disk body 315 of the substrate elevator 314 is positioned at the raised position. In this state, the arm of the substrate transfer device 17, which has moved into the chamber 20 through the loading/unloading port (not shown) provided on the side wall of the chamber 20, delivers the wafer W to the support pins 316 of the substrate elevator 314. Thereafter, the disk body 315 is lowered to the lowered position. The wafer W is gripped by the chuck portions 312 that has moved to the gripping position along with this movement, and the wafer W is slightly spaced apart from the support pins 316. Further, the disk body 315 engages with the base plate 311 of the substrate holder 31 so as not to rotate relative to each other. As a result, the wafer W is firmly held by the substrate holder 31. When the wafer W is unloaded from the processing unit 16, the procedure reverse to the above-described procedure may be executed.

A purge gas supply pipe 91 (purge gas nozzle) is provided inside the shaft 317 of the substrate elevator 314. The inside of the purge gas supply pipe 91 serves as a purge gas supply path. At the upper end of the purge gas supply pipe 91, one or more purge gas injection holes 92 are provided for injecting a purge gas into a space between the base plate 311 and the disk body 315.

The one or more purge gas injection holes 92 may include at least one of a purge gas injection hole for injecting a purge gas directly upward, a purge gas injection hole for injecting a purge gas in a horizontal direction, and a purge gas injection hole for injecting a purge gas obliquely upward. When a plurality of purge gas injection holes are provided in this way, a cap having a plurality of purge gas injection holes may be attached to the upper end of the purge gas supply pipe 91.

The purge gas supply pipe 91 is provided so that the non-rotating state thereof can be maintained even when the rotary shaft 313 of the substrate holder 31 and the shaft 317 of the substrate elevator 314 are rotating. The purge gas supply pipe 91 is provided so as not to move in the vertical direction even when the shaft 317 of the substrate elevator 314 is moved up and down.

Instead of providing the purge gas supply pipe 91 inside the shaft 317, the cavity in the shaft 317 may be provided as a purge gas supply path. In this case, the shaft 317 serves as a purge gas nozzle. In this case, for example, the purge gas can be supplied into the purge gas supply path via a rotary joint connected to the lower end of the shaft 317.

A purge gas supply mechanism 94 is connected to the purge gas supply pipe 91. The purge gas supply mechanism 94 includes a purge gas source 941 (for example, a nitrogen gas source for factory power), a gas supply path 942 connected to the purge gas supply pipe 91, and a flow control device 943 such as an on-off valve, a flow rate control valve, a flow meter and the like provided in the gas supply path 942. A dry air may also be used as the purge gas.

The processing fluid supplier 40 supplies a processing fluid (a processing liquid, a processing gas, or the like) to the wafer W. The processing fluid supplier 40 includes a plurality of processing liquid nozzles 41, 42 and 43 configured to discharge (supply) the processing liquid toward the wafer W held and rotated by the substrate holder 31. For example, a cleaning chemical (for example, DHF (dilute hydrofluoric acid)) is discharged from the processing liquid nozzle 41, DIW (deionized water, that is, pure water) as a rinsing liquid is discharged from the processing liquid nozzle 42, and a highly-volatile and low-surface-tension organic solvent for assisting in drying, for example, IPA (isopropyl alcohol), is discharged from the processing liquid nozzle 43. The processing liquid may include an alkaline chemical solution such as SC-1 or the like. The processing fluid may include a gas for assisting in drying such as a nitrogen gas blown onto the surface of the wafer W to accelerate the drying of the surface of the wafer W.

Each of the processing liquid nozzles (41 to 43) is connected to a processing liquid source and is supplied with a processing liquid (processing fluid) from a processing liquid supply mechanism (not shown) having a processing liquid supply path in which a flow rate regulator such as an on-off valve or a flow rate regulation valve is installed.

The processing liquid nozzles 41 to 43 are attached to one or more (one, in the illustrated example) nozzle arms 44. The nozzle arms 44 can be raised and lowered and swiveled by an arm drive mechanism 45, so that they can be moved between a processing position (arbitrary position between a location directly above the center of the wafer W and a location directly above the peripheral portion of the wafer) and a standby position outside the liquid receiving cup 50.

The liquid receiving cup 50 includes a plurality of cup bodies, that is, two cup bodies 51 and 52 in the illustrated example, one (52) of which is movable for flow path switching. Specifically, the liquid receiving cup 50 includes an immovable annular first cup body 51 located on the outer side, a vertically-movable annular second cup body 52 located on the inner side of the first cup body 51, and an immovable inner wall 54 located on the inner side of the second cup body 52.

As used herein, the expressions "radial direction (radially)" and "circumferential direction (circumferentially)" respectively refer to, unless otherwise specified, a radial (or diameter) direction and a circumferential direction about a center axis line (which is the same as the rotational center axis of the substrate holder 31) of the liquid receiving cup formed as a rotating body (rotating body in geometrical terms) as a whole.

The second cup body 52 located at the raised position is shown on the left side in FIG. 2, and the second cup body 52 located at the lowered position is shown on the right side in FIG. 2. The first and second cup bodies 51 and 52 and the inner wall 54 do not rotate. A first flow path 501 is formed between the first cup body 51 and the second cup body 52, and a second flow path 502 is formed between the second cup body 52 and the inner wall 54.

The second cup body 52 can be raised and lowered by an elevating mechanism 52EV schematically shown in FIG. 2. When the second cup body 52 is at the lowered position, an overhanging portion 5102 of the first cup body 51 and an overhanging portion 5202 of the second cup body 52 are spaced apart from each other, and the first flow path 501 is opened toward the vicinity of the peripheral edge of the wafer W (see the right half in FIG. 2). When the second cup body 52 is at the raised position, the overhanging portion 5102 and the overhanging portion 5202 are close to each other, and the second flow path 502 is opened toward the vicinity of the peripheral edge of the wafer W (see the left half in FIG. 2).

A bent portion is provided in the middle of each of the first flow path 501 and the second flow path 502, and a liquid component is separated from a gas-liquid mixture fluid flowing through each flow path by rapidly changing the direction at the bent portion. The separated liquid component falls into a liquid receiver 511 corresponding to the first flow path 501 and a liquid receiver 512 corresponding to the second flow path 502. The liquid receivers 511 and 512 are connected to the liquid drainage systems of a factory (as simplified and indicated by an arrow) corresponding to the type of chemical liquid (acidic, alkaline, and organic (acidic and organic in this example)) via the corresponding drainage ports 521 and 522.

At the bottom of the liquid receiving cup 50, a cup exhaust port 55 communicating with the first flow path 501 and the second flow path 502 is formed. A cup exhaust passage 56 is connected to the cup exhaust port 55.

A chamber exhaust port 57 for exhausting an internal atmosphere of the chamber 20 is provided below the chamber 20 (the housing of the processing unit 16) and outside the liquid receiving cup 50. A chamber exhaust passage 58 is connected to the chamber exhaust port 57. A flow rate control valve composed of, for example, a butterfly valve 59 is installed in the chamber exhaust passage 58.

The chamber exhaust passage 58 merges with the cup exhaust passage 56. A switching valve 53 is provided in the cup exhaust passage 56 on the downstream side of the merging portion. By switching the switching valve 53, the cup exhaust port 55 can be brought into communication with factory exhaust systems (an acid exhaust system, an alkaline exhaust system, an organic exhaust system, and the like) corresponding to the type of exhaust. Since the factory exhaust systems have a negative pressure (the level of the negative pressure is maintained almost constant), the atmosphere in the space communicating with the factory exhaust systems (the space inside the liquid receiving cup 50, the cup exhaust passage 56, and the chamber exhaust passage 58, and the like) is suctioned.

By adjusting the opening degree of the butterfly valve 59 of the chamber exhaust passage 58, it is possible to adjust an exhaust flow rate ratio between the cup exhaust passage 56 and the chamber exhaust passage 58. When the opening degree of the butterfly valve 59 is reduced, the exhaust flow rate of the cup exhaust passage 56 is increased. As a result, the inside of the liquid receiving cup 50 is suctioned more strongly.

The butterfly valve 59 may be provided only in the cup exhaust passage 56, or the butterfly valve 59 may be provided in both the cup exhaust passage 56 and the chamber exhaust passage 58.

The rotary cup 60 is attached to the base plate 311 of the substrate holder 31 and is rotated together with the base plate 311. The rotary cup 60 includes an upper cup body 61 and a lower cup body 62. The upper cup body 61 and the lower cup body 62 are fixed to the base plate 311 by a plurality of fixing members 63 (only one of which is shown in FIG. 2) attached to the outer peripheral portion of the base plate 311 at intervals along the circumferential direction.

When the inside of the liquid receiving cup 50 is suctioned through the cup exhaust passage 56, the gas (clean air discharged from the FFU) in the space above the upper opening of the liquid receiving cup 50 is drawn into the liquid receiving cup 50. Most of the air drawn into the liquid receiving cup 50 flows into the first flow path 501 or the second flow path 502 through the space between the upper cup body 61 and the lower cup body 62 (see arrow F1).

Further, when the substrate holder 31 and the wafer W rotate, the gas (clean air, nitrogen gas, etc.) existing near the surface of the disk-shaped rotating body (the wafer W, the base plate 311, the disk body 315, or the like) moves along the surface of the rotating body and flows toward the outer peripheral edge of the rotating body. The gas (see arrow F2) flowing on the upper surface (front surface) of the wafer W flows into the first flow path 501 or the second flow path 502 mainly through the space between the upper cup body 61 and the lower cup body 62. The gas (see arrow F3) flowing through the space between the lower surface (back surface) of the wafer W and the base plate 311 and the disk body 315 (hereinafter referred to as "wafer lower space S0" for the sake of convenience) flows into the first flow path 501 or the second flow path 502 mainly through the space between the upper cup body 62 and the base plate 311.

An example of the specific shapes and configurations of the liquid receiving cup 50 and the rotary cup 60 schematically shown in the subject application is specifically described in Japanese Patent Application Publication No. 2014-123713 corresponding to Japanese Patent Application No. 2013-205418 previously filed by the present applicant, the contents of which are incorporated herein by reference.

Next, the operation of the processing unit 16 automatically performed under the control of the control device 4 will be briefly described.

The unprocessed wafer W is loaded into the processing unit 16 by the substrate transfer device 17 and is held by the substrate holder 31. That is, the state shown in FIG. 2 is obtained. Then the wafer W starts rotating. The surface of the rotating wafer W is first supplied with a chemical solution (for example, an acidic chemical solution such as DHF or the like) and subjected to a chemical solution cleaning process (chemical solution cleaning step). Then, the surface of the rotating wafer W is supplied with a rinsing solution (for example, DIW) and subjected to a rinsing process (rinsing step).

Thereafter, a drying liquid (for example, IPA) is supplied to the surface of the rotating wafer W, and the rinsing liquid on the surface of the wafer W is replaced with the drying liquid (drying liquid replacement step). Next, the wafer W is dried by stopping the supply of the drying liquid and continuously rotating the wafer W (drying step).

While the above steps are being executed, the processing liquid (chemical liquid, rinsing liquid, drying liquid, or the like) supplied to the surface of the wafer W is scattered to the outside of the wafer W by virtue of a centrifugal force. The scattered liquid becomes minute droplets (mist) and floats around the wafer W (particularly, the space near the peripheral edge of the wafer W). If this mist is reattached to the wafer W, it causes particles.

Since the internal space of the liquid receiving cup 50 is constantly suctioned through the cup exhaust passage 56, the clean gas (clean air, clean dry air, clean air mixed with nitrogen gas, etc.) flowing downward from the FFU 21 is drawn into the liquid receiving cup 50, passes near the peripheral edge of the wafer W, flows into the first flow path 501 or the second flow path 502 (see arrow F1), and is discharged from the liquid receiving cup 50 through the cup exhaust port 55. The mist floating in the space near the peripheral edge of the wafer W flows into the first flow path 501 or the second flow path 502 along with the clean gas flow. The mist is separated from the clean gas while flowing through the first flow path 501 or the second flow path 502 and is discharged from the liquid receiving cup 50 through the drainage port 521 or the drainage port 522.

Here, attention is paid to the wafer lower space S0. When the wafer W is rotating, as described above, the gas existing in the wafer lower space S0 is dragged by the rotation of the wafer W, the base plate 311, and the disk body 315 to flow toward a radially outer space of the wafer lower space S0 (see arrow F3). Since the gas in the wafer lower space S0 goes out in this way, a pressure in the wafer lower space S0 (hereinafter referred to as "pressure P0") decreases.

A region near the outlet of the space between the upper cup body 61 and the lower cup body 62 in the first flow path 501 is referred to as "region S1," and a pressure in the region S1 is referred to as "pressure P1." Further, a region near the outlet of the space between the upper cup body 61 and the lower cup body 62 in the second flow path 502 is referred to as "region S2," and a pressure in the region S2 is referred to as "pressure P2." Further, a region of the cup exhaust passage 56 slightly upstream side of the merging point with the chamber exhaust passage 58 is referred to as "region S3," and a pressure in the region S3 is referred to as "pressure P3." In addition, a space outside the liquid receiving cup 50 and above the upper surface (front surface) of the wafer W in the chamber 20 is referred to as "space SC," and a pressure in the space SC is referred to as "pressure PC."

When the inlet of the first flow path 501 is opened, if the pressure P0 in the wafer lower space S0 becomes lower than the pressure P1 in the region S1 of the first flow path 501, a portion of the gas containing the mist of the processing liquid existing in the region S1 flows into the wafer lower space S0 (through the gap between the outer peripheral edge of the lower cup body 62 and the outer peripheral edge of the base plate 311). The mist flowing into the wafer lower space S0 adheres to the lower surface (back surface) of the wafer W and causes particles. Therefore, in order to prevent contamination of the lower surface of the wafer W, it is desirable that the pressure P0≥pressure P1 (hereinafter referred to as "condition 1") while the mist of the processing liquid is floating at least in the region S1.

Similarly, when the inlet of the second flow path 502 is opened, it is desirable that the pressure P0≥pressure P2 (hereinafter referred to as "condition 1").

Further, if the pressure P0 in the wafer lower space S0 becomes lower than the pressure PC in the region SC above the peripheral edge of the wafer, a portion of the gas containing the mist of the processing liquid existing in the region SC flows into the wafer lower space S0, for example, through the gap between the outer peripheral edge of the lower cup body 62 and the outer peripheral edge of the wafer W. Therefore, in order to prevent contamination of the lower surface of the wafer W, it is desirable that the pressure P0≥pressure PC (hereinafter referred to as "condition 2") while the mist of the processing liquid is floating at least in the region SC.

However, it is not preferable to reduce the pressures P1 and PC in order to satisfy the conditions 1 and 2. The gas flow (flow velocity, turbulent flow generation status, or the like) in the vicinity of the peripheral edge of the wafer W is mainly determined by a difference between the pressure PC in the space SC and the pressure P1 in the region S1. If the gas flow in the region S1 is improper, for example, the mist of the processing liquid separated from the wafer W may be reattached to the front surface of the wafer W so that the most important surface of the wafer W may be contaminated. In order to minimize such possibility, a cup exhaust flow rate (which determines the pressure P1) is controlled. Further, the pressure PC in the space SC is determined by the gas (clean air) supply flow rate of the FFU and the chamber exhaust flow rate. However, these two flow rates are not usually changed significantly and are maintained substantially constant. That is, the pressures P1 and PC are not values that should be changed significantly only to prevent contamination of the lower surface of the wafer W.

In one aspect of the actual operation of the apparatus, the cup exhaust flow rate is controlled by controlling the opening degree of the butterfly valve 59 of the chamber exhaust passage 58 depending on the content of the liquid processing and the rotation speed of the wafer W so that an optimum air flow is formed particularly in the vicinity of the wafer W. The negative pressure in the factory exhaust system is kept almost constant. When the opening degree of the butterfly valve 59 is increased, the exhaust flow rate of the chamber exhaust passage 58 increases while the exhaust flow rate of the cup exhaust passage 56 decreases. When the opening degree of the butterfly valve 59 is reduced, the opposite is true. When the cup exhaust flow rate is reduced, the pressure P3 in the region S3 of the cup exhaust passage 56 becomes high. When the cup exhaust flow rate is increased, the pressure P3 in the region S3 of the cup exhaust passage 56 becomes low.

Figure 3:
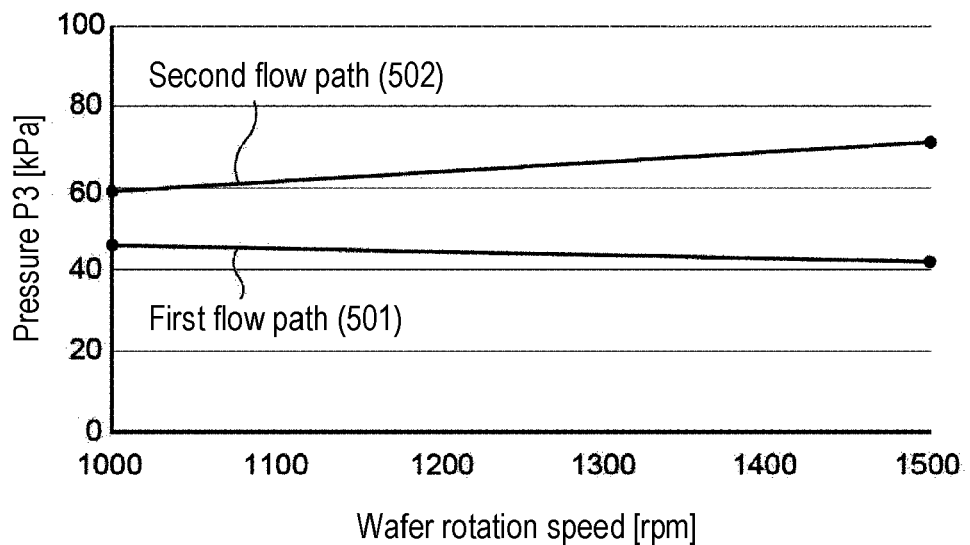
FIG. 3 is a graph for explaining setting of pressure inside a cup exhaust passage corresponding to a wafer rotation speed.

The graph of FIG. 3 shows an example of the actual operation of the apparatus. In the graph of FIG. 3, the horizontal axis indicates the rotation speed (rpm) of the wafer W, and the vertical axis indicates the pressure P3 in the region S3 of the cup exhaust passage 56. The lower line indicates the control when the first flow path 501 is formed in the liquid receiving cup 50, and the upper line indicates the control when the second flow path 502 is formed in the liquid receiving cup 50. Since the shape of the first flow path 501 and the shape of the second flow path 502 are different from each other, the relationship between the wafer rotation speed and the pressure P3 (that is, the opening degree of the butterfly valve 59) is changed so that the optimum airflow is formed near the peripheral edge portion of the wafer W.

The pressure P3 (that is, the cup exhaust flow rate) may be changed between a case in which the processing liquid to be used is a chemical liquid and a case in which the processing liquid to be used is a rinsing liquid. This is because the adverse effect when the mist of the chemical solution is reattached to the wafer W is greater than the adverse effect when the mist of the rinsing solution is reattached to the wafer W.

The relationship shown in the graph of FIG. 3 is a relationship in a state in which there is no gas discharge from the purge gas supply pipe 91. When the wafer W is rotated, the gas is pushed into the first flow path 501 or the second flow path 502 due to the influence of the above-mentioned airflows F2 and F3. Therefore, when the rotation speed of the wafer W is increased, the pressure P3 in the region S3 of the cup exhaust passage 56 becomes high. The value of the pressure P3 shown in the graph of FIG. 3 is a value including the influence.

It has already been confirmed that when the opening degree of the butterfly valve 59 is constant, there is a relationship in which if the pressure P3 in the region S3 of the cup exhaust passage 56 is increased (decreased), the pressure P1 in the region S1 of the first flow path 501 is also increased (a positive correlation exists), the tendency of changes in the pressure P3 and the pressure P1 is similar, and the pressure P3 is higher than the pressure P1. Due to the configuration of the liquid receiving cup 50, it is difficult to directly measure the pressure P1. Therefore, in the following description, the pressure P3 measured by the pressure sensor provided in the cup exhaust passage 56 is used as an index of the pressure P1 (an index of whether the gas flows into the wafer lower space S0 from the first flow path 501). The same can be said about the relationship between the pressure P3 and the pressure P2 even when the second flow path 502 is opened.

Now, description will be made on a configuration that the gas containing the mist of the processing liquid is prevented from flowing into the wafer lower space S0. As described above, it is not preferable to lower (change) the pressure P1 (or the pressure P2) and the pressure PC in order to satisfy the condition 1 (or the condition 1') and the condition 2. Therefore, it is preferable to satisfy the above conditions 1 (or condition 1') and 2 by increasing the pressure P0 in the wafer lower space S0. For that purpose, the flow rate of the gas discharged from the purge gas supply pipe 91 into the wafer lower space S0 may be increased.

However, if the flow rate of the gas discharged from the purge gas supply pipe 91 is increased excessively, the temperature of the wafer W may decrease at the portion where the gas collides, and the in-plane uniformity of the temperature of the wafer W may be impaired.

Next, description will be made on experimental results of investigating the amount of particles generated on the back surface of the wafer W when the liquid processing is performed on the front surface of the wafer W by changing the flow rate of the gas discharged from the purge gas supply pipe 91 (hereinafter also referred to as "purge gas discharge flow rate B" for the sake of convenience in description). The rotation speed of the wafer W (hereinafter also referred to as "wafer rotation speed R" for the sake of convenience) was set to 1,000 rpm and 1,500 rpm. In this experiment, the opening degrees of the butterfly valve 59 respectively corresponding to the wafer rotation speeds R of 1,000 rpm and 1,500 rpm were set so that the pressure P3 in the region S3 of the cup exhaust passage 56 shown in the graph of FIG. 3 is realized when the purge gas discharge flow rate B is zero. That is, the pressure P3 is 59 kPa when the wafer rotation speed R is 1,000 rpm, and the pressure P3 is 71 kPa when the wafer rotation speed R is 1,500 rpm. The opening degree of the butterfly valve 59 was maintained at the opening degree available when the purge gas discharge flow rate B is zero (that is, the opening degree of the butterfly valve 59 was not changed according to the change of the purge gas discharge flow rate B).

Figure 4:
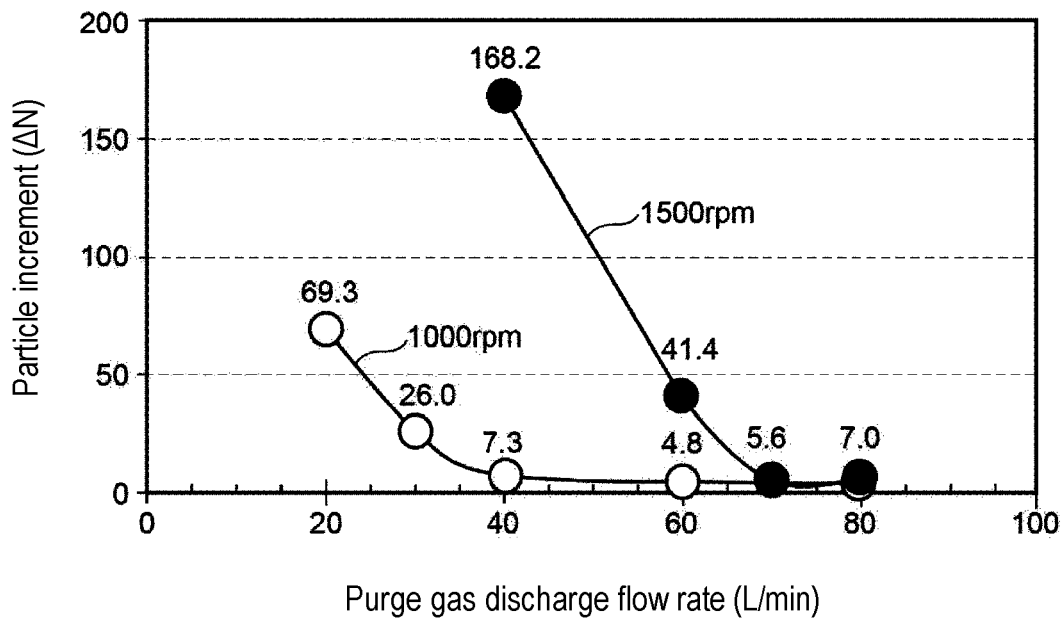
FIG. 4 is a graph showing experimental results of investigating a relationship between a purge gas discharge flow rate and a particle increment.

The graph of FIG. 4 shows results of an experiment conducted in a state in which the second flow path 502 is formed in the liquid receiving cup 50. In the graph of FIG. 4, the horizontal axis indicates the purge gas discharge flow rate B (L/min), and the vertical axis indicates the numerical value obtained by subtracting the number of particles having a size of 40 nm or more before the liquid processing from the number of particles having a size of 40 nm or more after the liquid processing, that is, the particle number increment ($\Delta$N) (Adder Particle Counts). The plots of ○ (white circles) indicate the data available when the wafer rotation speed is 1,000 rpm, and the plots of ● (black circles) indicate the data available when the wafer rotation speed is 1,500 rpm.

When the wafer rotation speed R is 1,000 rpm, the particle number increment ($\Delta$N) decreases as the purge gas discharge flow rate B increases (because the pressure P0 in the wafer lower space S0 increases), and the particle number increment at 40 L/min decreases to a level at which no problem is posed. That is, at this time, it can be considered that the negative pressure generated in the wafer lower space S0 due to the rotation of the wafer W is canceled by the purge gas supplied to the wafer lower space S0.

As described above, if the wafer rotation speed R is constant, the opening degree of the butterfly valve 59 is kept constant regardless of the purge gas discharge flow rate B. Therefore, as the amount of the gas flowing into the first flow path 501 increases due to the increase in the gas discharge flow rate from the purge gas supply pipe 91, the pressure P3 in the region S3 of the cup exhaust passage 56 also increases. The pressure P3 was 59 kPa when the purge gas discharge flow rate B is 0 L/min (no discharge), and the pressure P3 was 62 kPa when the purge gas discharge flow rate B is 40 L/min. The difference between the two pressures (59 kPa−62 kPa=−3 kPa) can be used as an index ($\Delta$P) representing the depressurized state in the wafer lower space S0 when the wafer rotation speed is 1,000 rpm.

Figure 5:
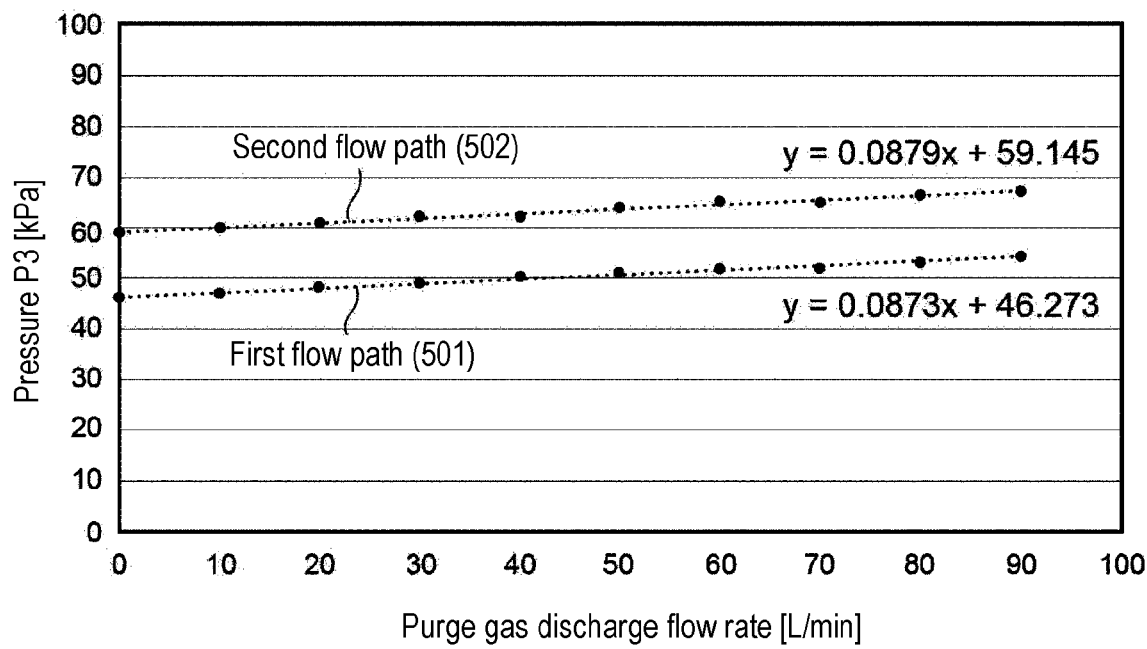
FIG. 5 is a graph showing a relationship between the purge gas discharge flow rate and the pressure inside the cup exhaust passage.

FIG. 5 shows a relationship between the purge gas discharge flow rate B and the pressure P3 when the wafer rotation speed R is 1,000 rpm, which is obtained when the same experiment as above is performed in a case in which the first flow path 501 is formed in the liquid receiving cup 50 and a case in which the second flow path 502 is formed in the liquid receiving cup 50. In any case, it can be noted that the pressure P3 increases substantially linearly as the purge gas discharge flow rate B increases.

Next, a case in which the wafer rotation speed is 1,500 rpm will be described. Also in this case, the opening degree of the butterfly valve 59 was controlled so that the pressure P3 in the region S3 of the cup exhaust passage 56 when the purge gas discharge flow rate B is 0 L/min (no discharge) becomes a value (71 kPa) according to the graph of FIG. 3. In addition, a second flow path 502 was formed in the liquid receiving cup 50. In this case, as shown in the graph of FIG. 4, when the gas discharge flow rate reached 70 L/min, the particle number increment decreased to a level at which no problem is posed, and the pressure P3 at that time was 76 kPa. From this result, the value of the index ($\Delta$P) representing the depressurized state in the wafer lower space S0 when the wafer rotation speed is 1,500 rpm is 71 kPa−76 kPa=−5 kPa.

From the above experimental results, it can be noted that the higher the wafer rotation speed R, the greater the degree of depressurization in the wafer lower space S0, and the purge gas discharge flow rate B required for eliminating the decompression (that is, for preventing the mist of the processing liquid from invading into the wafer lower space S0) is large. As described above, if the purge gas discharge flow rate B is increased excessively, there is a high possibility that the in-plane temperature uniformity of the wafer W will be impaired. Therefore, it is preferred that the gas is discharged at the minimum required purge gas discharge flow rate B that satisfies the condition that the pressure in the wafer lower space S0 does not allow the mist of the processing liquid to enter the wafer lower space S0 (or a purge gas discharge flow rate slightly higher than the minimum required purge gas discharge flow rate B).

Based on the above description, some specific examples of the control method of the purge gas discharge flow rate B in the processing unit 16 will be described. The control described below can be performed, for example, under the control of the control device 4 (see FIG. 1). The control program, the processing recipe, and the like can be stored in the memory part 19.

<First Control Method>

In each time section in the processing recipe, the purge gas discharge flow rate B is determined in advance by an experiment. By performing the same experiment as the experiment described above with reference to FIG. 4 in all time sections with different processing conditions, the purge gas discharge flow rate B (preferably the minimum value thereof) at which the particle increment ($\Delta$N) does not become a problem is obtained. Then, the obtained purge gas discharge flow rate B is written in each time section of the processing recipe. The control device 4 controls the purge gas supply mechanism 94 so that the purge gas discharge flow rate B written in the processing recipe stored in the memory part 19 is realized.

In addition, instead of obtaining the purge gas discharge flow rate B experimentally in all the time sections with different processing conditions, for a plurality of similar time sections with slightly different processing conditions, the purge gas discharge flow rate B in other time sections may be determined based on the experiment performed for the representative time section. For example, for two different types of chemicals whose properties such as viscosity (properties involved in mist formation) do not change so much, the purge gas discharge flow rate B determined in relation to one chemical solution may be used for the other chemical solution.

<Second Control Method>

The purge gas discharge flow rate B may be calculated based on a table (relationship table) or a function obtained in advance by an experiment, and the control device 4 may control the purge gas supply mechanism 94 so that the calculated purge gas discharge flow rate B is realized. That is, in this case, the purge gas discharge flow rate B is not written in the processing recipe.

The following are exemplified as parameters (excluding the purge gas discharge flow rate B) that define the operating conditions of the processing unit capable of determining whether the gas containing mist can enter the wafer lower space S0.

(1) Flow path (the first flow path 501 or the second flow path 502) in the liquid receiving cup 50 used (this can be represented by, for example, the height position information of the vertically-movable second cup body 52)

(2) Rotation speed of the wafer W (the substrate holder 31)

(3) Cup exhaust flow rate (set opening degree of the butterfly valve 59)

(4) Types of processing liquid discharged from the processing liquid nozzles 41 to 43 (including the temperature)

(5) Position of the landing point of the processing liquid discharged from the processing liquid nozzles 41 to 43 on the surface of the wafer W (including the case of nozzle scan) (which may be represented by, for example, nozzle position information).

(6) Discharge flow rate of the processing liquid discharged from the nozzle (7) Supply flow rate of the gas (for example, clean air) supplied from the FFU (8) Pressure SC in the chamber 20 (a pressure sensor may be provided to measure the supply flow rate)

(9) Pressure P3

Since the above-mentioned parameters are not completely independent and may have a correlation, some of the parameters may be omitted. For example, since the pressure SC in the chamber is determined substantially by the gas supply flow rate supplied from the FFU, either (6) or (7) may be omitted.

The memory part 19 of the control device 4 stores a table or a function which indicates the relationship between at least some of the above parameters (1) to (9) (for example, parameters (1) to (4)) and the purge gas discharge flow rate B to be adopted. The control device 4 reads at least some values of the above parameters written in the processing recipe stored in the memory part 19 and applies the values to the above table or function to thereby obtain the purge gas discharge flow rate B. Then, the control device 4 controls the purge gas supply mechanism 94 so that the obtained purge gas discharge flow rate B is realized.

<Third Control Method>

Figure 6:
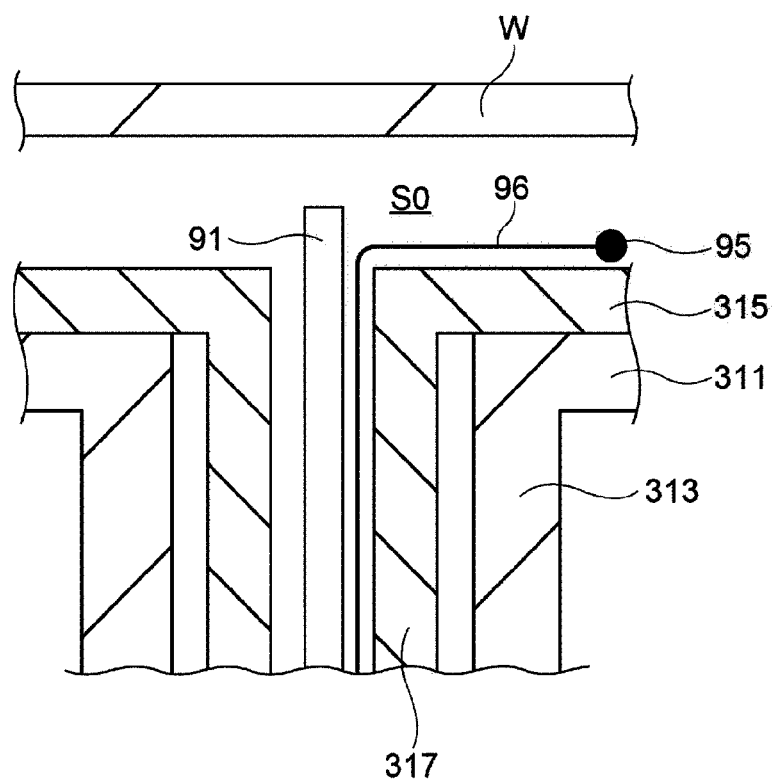
FIG. 6 is a schematic view showing an embodiment in which a pressure sensor is provided in a space below a wafer.

As schematically shown in FIG. 6, a pressure sensor 95 for directly measuring the pressure P0 in the wafer lower space S0 may be provided in the wafer lower space S0. A detection signal of the pressure sensor 95 is output to a signal line 96. The signal line 96 may be pulled out through the cavity of the rotary shaft 313 into which the purge gas supply pipe 91 is inserted. The signal line 96 may be inputted to, for example, the control device 4.

In order to arrange the pressure sensor 95 and the signal line 96 so as not to come into direct contact with the rotary shaft 313 and not to come into contact with the base plate 311 and the disk body 315, the signal line 96 may be formed by a thick covered electric wire having sufficiently high rigidity. Alternatively, the signal line 96 may be accommodated inside a highly rigid sheath (not shown). A gauge pressure may be measured by the pressure sensor 95 by bringing the internal space of the sheath into communication with the atmospheric pressure space and supplying a reference atmospheric pressure to the pressure sensor 95.

When the pressure sensor 95 is provided inside the wafer lower space S0, for example, the following operations may be performed.

Operation Example 1

In each time section in the processing recipe, the same experiment as the experiment executed to obtain the graph of FIG. 4 is performed while changing the purge gas discharge flow rate B, whereby a relationship between the detection value of the pressure sensor 95 and the particle increment ($\Delta N$) is obtained. Then, based on this relationship, the detection value (preferably the minimum value) of the pressure sensor 95 at which the particle increment ($\Delta N$) does not matter is obtained for each processing condition. Then, the obtained detection value of the pressure sensor 95 is written in each time section of the processing recipe. The control device 4 feedback-controls the purge gas supply mechanism 94 so that the detection value of the pressure sensor 95 written in the processing recipe stored in the memory part 19 is realized.

Operation Example 2

As shown in the graph of FIG. 5, there is a correlation between the purge gas discharge flow rate B and the pressure P3. It is clear that there is a positive correlation between the purge gas discharge flow rate B and the pressure P0 in the wafer lower space S0. As described above, there is a positive correlation between the pressure P3 and the pressure P1 (or the pressure P2). Pressure P0≥pressure P1 (condition 1) is one condition under which the particle increment ($\Delta N$) does not matter. Therefore, first, the estimated value of the pressure P1 is calculated from the pressure P3 actually measured based on the known relationship between the pressure P3 and the pressure P1. Then, the purge gas supply mechanism 94 may be feedback-controlled so that the estimated value of the pressure P1 and the pressure P0 directly measured by the pressure sensor 95 satisfy the above condition 1. Even when it is necessary to satisfy the above-mentioned condition 2 (pressure P0≥pressure PC), the purge gas supply mechanism 94 may be feedback-controlled in the same way.

In the above case, it is necessary to provide a pressure sensor (not shown) for actually measuring the pressure P3 and a pressure sensor (not shown) for actually measuring the pressure P0. If it is necessary to satisfy both the condition 1 and the condition 2 at the same time, the purge gas supply mechanism 94 may be feedback-controlled so as to satisfy the condition that the pressure P0 is equal to or higher than the pressure P1 or PC whichever is larger.

The embodiments disclosed herein should be considered to be exemplary and not limitative in all respects. The above embodiments may be omitted, replaced, or modified in various forms without departing from the scope of the appended claims and their gist.

Further, even in the liquid processing in which the peripheral portion of the lower surface (back surface) of the substrate is a processing target, the particles at the central portion of the lower surface of the substrate can be reduced by using the technique described in the above embodiment. When the processing liquid is supplied from the nozzle to at least the peripheral edge of the lower surface of the substrate in this way, it is preferred that a small amount of purge gas is always discharged from the purge gas supply pipe 91 in order to prevent the processing liquid from entering the shaft 317 or the purge gas supply pipe 91.

The substrate is not limited to the semiconductor wafer and may be a substrate made of other materials such as glass, ceramic, and the like.

According to the present disclosure in some embodiments, it is possible to reduce particles on a lower surface of a substrate.

While certain embodiments have been described, these embodiments have been presented by way of example only and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
   a chamber;
   a substrate holder provided inside the chamber and configured to hold a substrate in a horizontal posture, the substrate holder including:
      a disk-shaped base member;
      a plurality of holding members provided on a peripheral edge portion of the disk-shaped base member and configured to hold the substrate so as to be spaced apart upward from the disk-shaped base member; and
      a hollow rotary shaft extending downward from a central portion of a lower surface of the base member;
   a rotary driver configured to rotationally drive the substrate holder by rotating the hollow rotary shaft about a vertical axis;
   a processing liquid nozzle configured to supply a processing liquid to the substrate held by the substrate holder;
   a liquid receiving cup provided around the substrate holder and configured to receive the processing liquid scattered from the substrate held and rotated by the substrate holder;
   a cup exhaust passage configured to suction an atmosphere in the liquid receiving cup, the cup exhaust passage having a first end connected to an exhaust port of the liquid receiving cup and a second end connected to a negative pressure generation source;
   a purge gas nozzle provided inside the hollow rotary shaft, and configured to discharge a purge gas into a substrate lower space formed between a lower surface of the substrate held by the substrate holder and an upper surface of the disk-shaped base member;
   a purge gas valve configured to control a flow rate of the purge gas discharged from the purge gas nozzle;
   a chamber exhaust passage configured to suction an atmosphere in the chamber, the chamber exhaust passage having a first end connected to an exhaust port of the chamber and a second end connected to the cup exhaust passage;
   an exhaust valve provided in the chamber exhaust passage; and
   a controller configured to control at least an operation of the purge gas valve and adjust an opening degree of the exhaust valve,
   wherein the controller is programmed to adjust the opening degree of the exhaust valve to set a pressure in a region of the cup exhaust passage to be a predetermined pressure, and further programmed to control, while maintaining the adjusted opening degree of the exhaust valve, the flow rate of the purge gas by the purge gas valve to be a minimum value that cancels a negative pressure generated in the substrate lower space.

2. The substrate processing apparatus of claim 1, wherein the controller is further programmed to control the purge gas valve so that the purge gas is discharged from the purge gas nozzle at a flow rate defined in advance in a processing recipe stored in the controller.

3. The substrate processing apparatus of claim 1, wherein the controller is further programmed to store a table or a function indicating a relationship between at least one processing parameter defined in a processing recipe other than the flow rate of the purge gas and the flow rate of the purge gas required to realize the cancellation of the negative pressure,
   wherein the at least one processing parameter includes at least a rotation speed of the substrate holder, and
   wherein the controller is further programmed to determine a flow rate of the purge gas based on the table or the function and control the purge gas valve so that the purge gas is discharged from the purge gas nozzle at the determined flow rate.

4. The substrate processing apparatus of claim 3, wherein the at least one processing parameter further includes at least one of a flow rate of an exhaust gas through the cup exhaust passage, a pressure in the cup exhaust passage, and the opening degree of the exhaust valve provided in the chamber exhaust passage.

5. The substrate processing apparatus of claim 4, wherein the liquid receiving cup is configured so that at least two switchable flow paths are formed inside the liquid receiving cup, and
   wherein the at least one processing parameter further includes a parameter that determines a flow path to be used.

6. The substrate processing apparatus of claim 3, wherein the liquid receiving cup is configured so that at least two switchable flow paths are formed inside the liquid receiving cup, and
   wherein the at least one processing parameter further includes a parameter that determines a flow path to be used.

7. The substrate processing apparatus of claim 1, further comprising a pressure sensor configured to detect a pressure in the substrate lower space,
   wherein the controller is further programmed to determine a flow rate of the purge gas capable of canceling the negative pressure generated in the substrate lower space based on at least the pressure detected by the pressure sensor and control the purge gas valve so that the purge gas is discharged from the purge gas nozzle at the determined flow rate of the purge gas.

8. A substrate processing method executed in a substrate processing apparatus that includes: a chamber; a substrate holder provided inside the chamber and configured to hold a substrate in a horizontal posture, the substrate holder including a disk-shaped base member, a plurality of holding members provided on a peripheral edge of the disk-shaped base member and configured to hold the substrate so as to be spaced apart upward from the disk-shaped base member, and a hollow rotary shaft extending downward from a central portion of a lower surface of the base member; a rotary driver configured to rotationally drive the substrate holder by rotating the hollow rotary shaft about a vertical axis; a processing liquid nozzle provided inside the chamber and configured to supply a processing liquid to the substrate held by the substrate holder; a liquid receiving cup provided inside the chamber and around the substrate holder and configured to receive the processing liquid scattered from the substrate held and rotated by the substrate holder; a cup exhaust passage configured to suction an atmosphere in an interior of the liquid receiving cup, and including a first end connected to an exhaust port of the liquid receiving cup and a second end connected to a negative pressure generation source; a purge gas nozzle provided inside the hollow rotary shaft, and configured to discharge a purge gas into a substrate lower space formed between a lower surface of the substrate held by the substrate holder and an upper surface of the disk-shaped base member; a purge gas valve configured to control a flow rate of the purge gas discharged from the purge gas nozzle; a chamber exhaust passage configured to suction an atmosphere in the chamber, the chamber exhaust passage having a first end connected to an exhaust port of the chamber and a second end connected to the cup exhaust passage; and an exhaust valve provided in the chamber exhaust passage, the substrate processing method comprising:

rotating the substrate held by the substrate holder about the vertical axis;

supplying the processing liquid to the rotating substrate;

suctioning the interior of the liquid receiving cup through the cup exhaust passage such that a gas existing above the substrate is allowed to flow into the liquid receiving cup through a vicinity of a peripheral edge portion of the substrate;

adjusting an opening degree of the exhaust valve to set a pressure in a region of the cup exhaust passage to be a predetermined pressure; and while maintaining the adjusted opening degree of the exhaust valve, controlling the flow rate of the purge gas by the purge gas valve to be a minimum value that cancels a negative pressure generated in the substrate lower space.

* * * * *